(12) United States Patent
Heggemeier et al.

(10) Patent No.: US 7,952,439 B1
(45) Date of Patent: May 31, 2011

(54) SYSTEM AND METHOD FOR PHASE LOCKING MULTIPLE OSCILLATORS

(75) Inventors: Jeffry P. Heggemeier, Albuquerque, NM (US); James P. O'Loughlin, Placitas, NM (US); Matthew T. Domonkos, Albuquerque, NM (US); Robert Achenbach, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 45 days.

(21) Appl. No.: 12/623,631

(22) Filed: Nov. 23, 2009

(51) Int. Cl.
*H03L 7/24* (2006.01)
(52) U.S. Cl. ............................................. 331/55; 331/56
(58) Field of Classification Search ............... 331/5, 46, 331/55, 56, 74, 77, 96, 172
See application file for complete search history.

(56) References Cited

U.S. PATENT DOCUMENTS 5,757,241 A * 5/1998 Simonutti ..................... 331/55

OTHER PUBLICATIONS

Alder, Robert, "A Study of Locking Phenomena in Oscillators," Proc. I.R.E. and Waves and Electons, Jun. 1946; pp. 351-357.

* cited by examiner

*Primary Examiner* — David Mis
(74) *Attorney, Agent, or Firm* — Kenneth E Callahan

(57) ABSTRACT

Multiple microwave oscillators can be phase locked such that the power output of multiple oscillators can be coherently combined to achieve a single output which has the total sum power of the multiple oscillators. Multiple oscillators assembled in a power combining array are phase locked using a locking signal provided at each oscillator via strategic placement of a partial obstruction between combined multiple oscillators and a load. This locking signal includes a minimum threshold level and preselected phase. A method for phase locking multiple microwave oscillators includes steps of combining power output of multiple microwave oscillators to achieve a single output to a load and inserting a partial obstruction between said at least two multiple oscillators and said load. The partial obstruction configured to provide a combined microwave oscillator signal including a minimum threshold and preselected phase.

11 Claims, 7 Drawing Sheets

Top Wall 3dB

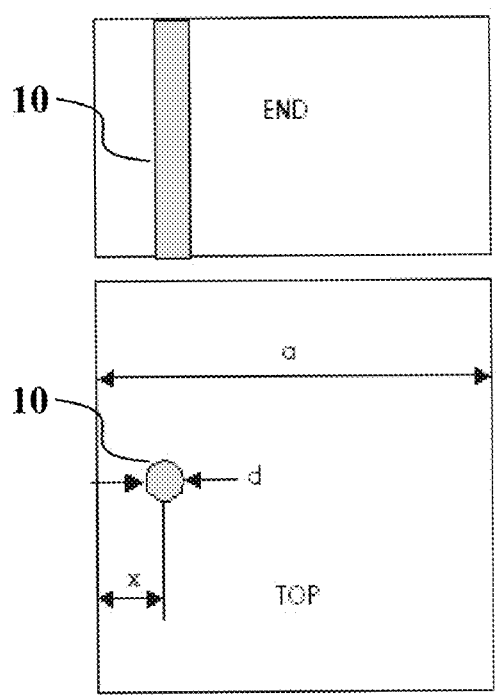
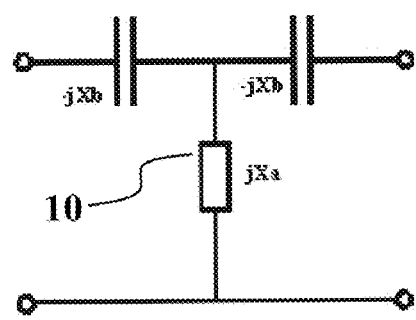
FIG. 5B
FIG. 5A

SYSTEM AND METHOD FOR PHASE LOCKING MULTIPLE OSCILLATORS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

FIELD OF THE INVENTION

Embodiments of the present invention are generally related to the field of microwave oscillators. More particularly, embodiments of the present invention are related to systems and methods for phase locking multiple microwave oscillators so that power output levels can be coherently combined to achieve a single output from a total sum of multiple oscillators.

BACKGROUND

There are a variety of high power microwave applications that require a power level that is in excess of the highest power available from a single microwave source. To fulfill such needs, the logical approach is to combine the power of a sufficient number of the highest power available sources. In order to satisfactorily combine sources it is necessary that they be at the same frequency and phase, i.e., that they be "phase locked". The commonest combining method of phase locked microwave sources, well known to those skilled in the art, is via an assembly of four port hybrid components such as the "magic tee" (FIG. 1A), the side wall 3 dB coupler (FIG. 1B), or the top wall 3 dB coupler (FIG. 1C). In the case of the magic tee, if the phase locked inputs are of equal magnitude, in phase, and applied to ports 1 and 2, then the combined power of 1 and 2 will exit port 3 and no power will exit port 4. For the side wall 3 dB coupler, if the phase locked inputs are of equal magnitude, and source 2 lags source 1 by 90 degrees (−j), then the combined power of 1 and 2 will exit port 3 and no power will exit port 4. For the top wall 3 dB coupler, if the phase locked inputs are of equal magnitude and source 2 leads source 1 by 90 degrees (j), then the combined power of 1 and 2 will exit port 3 and no power will exit port 4. In all cases if the phase locked sources are not equal in magnitude and/or the phase relations are not as stated above, then some of the power will exit port 3 and some will exit port 4. The exact amount is determined by applying the respective amplitudes and phases of the sources to the appropriate scattering matrix. The discussion following refers to the magic tee, but it could equally apply to the other two combiners with appropriate consideration for their scattering matrices.

Referring to the Magic Tee in FIG. 1A, if microwave power P1 at phase $\theta 1$ is applied to port 1, P2 at phase $\theta 2$ is applied to port 2, and both are at the same frequency, then the power exiting port 3 is:

$$P3 = \frac{P1 + P2}{2} + \sqrt{P1 \cdot P2} \cos(\theta 1 - \theta 2) \quad \text{(EQ. 1)}$$

And the power exiting port 4 is:

$$P4 = \frac{P1 + P2}{2} - \sqrt{P1 \cdot P2} \cos(\theta 1 - \theta 2) \quad \text{(EQ. 2)}$$

Equations 1 and 2 show that if P1=P2 and the phase difference, $\theta 1 - \theta 2$ is zero, then the total power, P1+P2, exits port 3 and zero power exits port 4. According to Equation 2, if P1 is not equal to P2 and/or $\theta 1$ is not equal to $\theta 2$, then less than the total power exits port 3 and the remaining power exits port 4. To efficiently employ the magic tee to combine the power from two sources it is essential that both the power levels and phases applied to ports 1 and 2 are substantially equal, which is possible if the amplitudes are equal and they are phase locked.

If the complex signal amplitudes A1 and A2, corresponding to the powers P1 and P2 applied to ports 1 and 2 are not phase locked, then the power from each behaves independently and in accordance with the mathematical expression of the following scattering matrix:

$$\underset{\sim\sim\sim}{S} := \frac{1}{\sqrt{2}} \cdot \begin{pmatrix} 0 & 0 & 1 & 1 \\ 0 & 0 & 1 & -1 \\ 1 & 1 & 0 & 0 \\ 1 & -1 & 0 & 0 \end{pmatrix}$$

Specifically, the P1 power divides equally between port 3 and port 4, and the P2 power divides equally between port 3 and port 4. No power is cross coupled between ports 1 and 2 provided that ports 3 and 4 are match terminated.

A magic tee arrangement can provide a means for combining the power from two phase locked sources. A combination of magic tees provide the means for combining the power from any number of phase locked sources with the constraint that the total number is $2^n$, n being an integer. The effectiveness or efficiency of the combination is determined by the application of Equations 1 and 2. It is obvious that the best results can occur when the sources are as identical as possible in both amplitude and phase.

An example of an array of 3 magic tees for the combination of 4 sources, M1-M4, is shown in FIG. 2. Ports 4 of the magic tees are terminated in matched loads, L, to dissipate the power resulting from any possible mismatches of power and/or phase of the sources. The combined power exits from port 3 of the magic tee labeled T21 and any power due to mismatches exits to port 4 into the matched termination.

In order to successfully combine oscillator power in a magic tee array, some means must be employed to accomplish the phase locking of the input sources. Phase locked sources fall into two general categories: master oscillator power amplifiers (MOPA) and phase-locked oscillators. The MOPA types include klystrons, traveling wave tubes (TWT), various cross field amplifiers (CFA) such as amplitrons, and solid state amplifiers. The phase locking of the MOPA configuration is accomplished by the master oscillator providing the same phase drive to each of the amplifiers. The present invention does not apply to MOPA type sources, but only to phase-locked oscillators. Thus in addition to the assembly of magic tees shown in FIG. 2, there must also be a means for achieving the phase locking of the four oscillators.

The theory of phase-locked oscillators is well documented in the art. Early examples of the implementation of phase locking and power combining of magnetrons have been demonstrated. The magnetron is the most common high power microwave oscillator used in a phase locked applications and has the advantage of being the most efficient of the oscillator types. The theory and practice of phase-locked oscillators extends from the early 1900's and the basic principle of operation is based on providing a cross coupling signal between the oscillators with the proper phase at a greater than threshold amplitude.

Means of providing the cross coupled signal has heretofore been a complicated array of waveguide components in addition to the power combining array. An example of such an apparatus is shown in FIG. 3. The apparatus shown in FIG. 3 includes both the power combining magic tee and the components required to accomplish the phase locking of the two magnetrons, M1 and M2. The phase locking is accomplished by the use of circulators, 5 and 6, and directional couplers 7 and 8. A sample of the power output from the magnetrons, M1 and M2, is obtained by means of the couplers 7 and 8. The sample is then injected by means of the circulators, 5 and 6, into the magnetrons M1 and M2. The magnetrons are thus cross coupled with sample signals of the appropriate amplitude and phase to accomplish phase locking Respectively referenced, the outputs of the phase locked magnetrons, M1 and M2, are passed through the circulators, 5 and 6, and then to the input ports of the magic tee, ports 1 and 2, where they combine and exit through port 3 to the load.

Other configurations for phase locking and power combining are known in the art, each requiring considerable additional apparatus to accomplish the phase locking with respect to the power combining apparatus. What is still needed in the art is a simpler and more efficient means for phase locking multiple microwave oscillators such that the power output of several oscillators can be coherently combined to achieve a single output which has the total sum power of the multiple oscillators.

SUMMARY OF THE INVENTION

The following summary is provided to facilitate an understanding of some of the innovative features unique to the present invention and is not intended to be a full description. A full appreciation of the various aspects of the embodiments disclosed herein can be gained by taking the entire specification, claims, drawings, and abstract as a whole.

It is a feature of the present invention to provide a simple and efficient means of phase locking multiple microwave oscillators such that the power output of several oscillators can be coherently combined to achieve a single output which has the total sum power of the multiple oscillators.

In accordance with features of the present invention, at least two multiple oscillators assembled in a power combining array, a load and a partial obstruction inserted between said at least two multiple oscillators and said load and configured to provide a locking signal including a minimum threshold and preselected phase.

In accordance with a method of the present invention, microwave oscillators are phased locked by combining the power output of multiple microwave oscillators to achieve a single output to a load and inserting a partial obstruction between said at least two multiple oscillators and said load. The partial obstruction is further configured to provide a combined microwave oscillator signal including a minimum threshold and preselected phase. The signal reflected from the partial obstruction flows back to each of the multiple oscillators with the same amplitude and phase and provides the injection locking signal to accomplish the phase locking of the multiple oscillators.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

FIG. 5A illustrates the introduction of a post as a partial obstruction in a waveguide.

FIG. 5B shows the equivalent circuit for the partially obstructed waveguide of FIG. 5A.

DETAIL DESCRIPTION

The particular values and configurations discussed in these illustrative examples can be varied and are cited merely to illustrate at least one embodiment and are not intended to limit the scope of such embodiments.

Figure 1A:
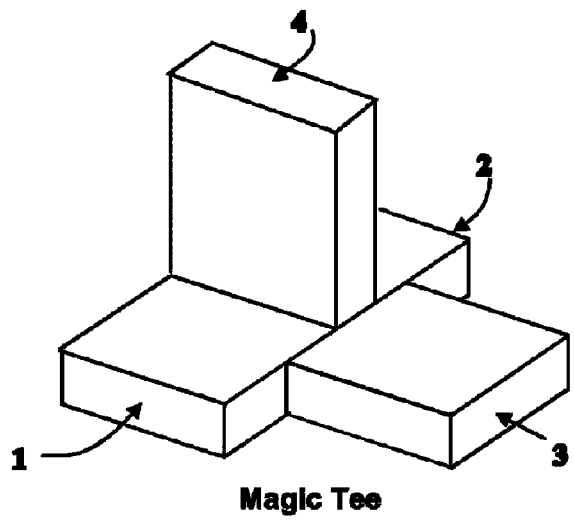
FIG. 1A, labeled as "prior art," illustrates a block diagram of a magic tee and its scattering matrix for use with waveguide oscillators.
Figure 1B:
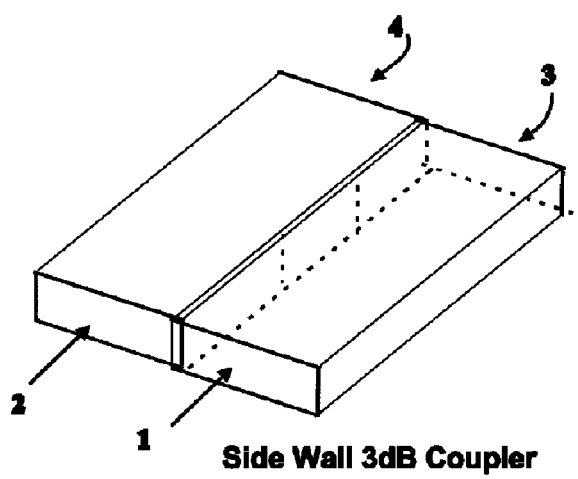
FIG. 1B, labeled as "prior art," illustrates a block diagram of a side wall 3 dB coupler and its scattering matrix for use with waveguide oscillators.
Figure 1C:
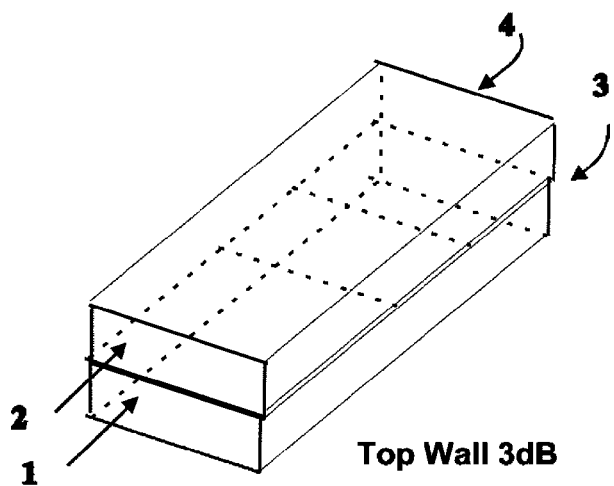
FIG. 1C, labeled as "prior art," illustrates a block diagram of a top wall 3 dB coupler and its scattering matrix for use with waveguide oscillators.
Figure 2:
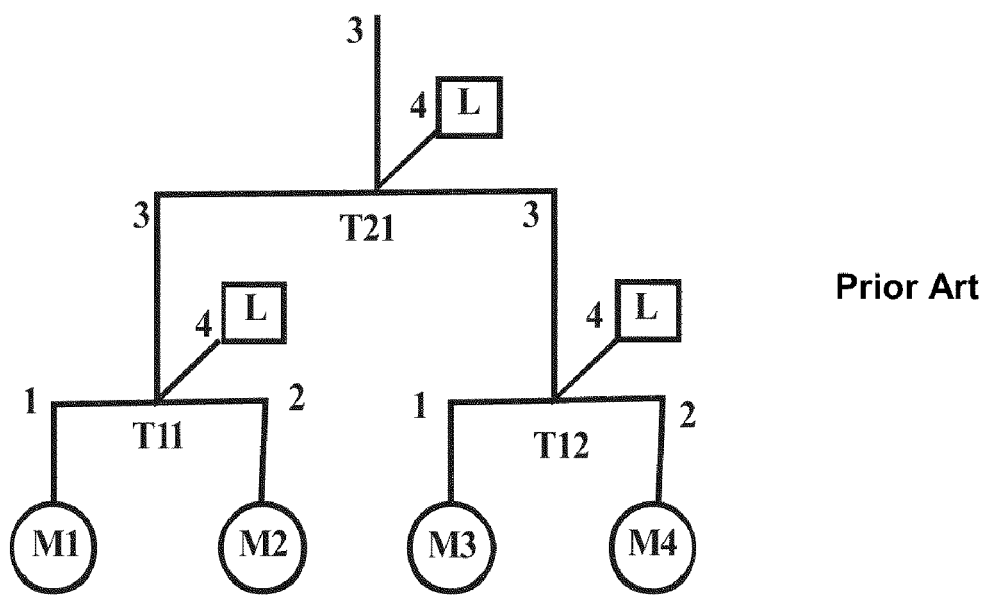
FIG. 2, labeled as "prior art," illustrates a magic tee assembly schematic for combining power from four microwave sources.
Figure 3:
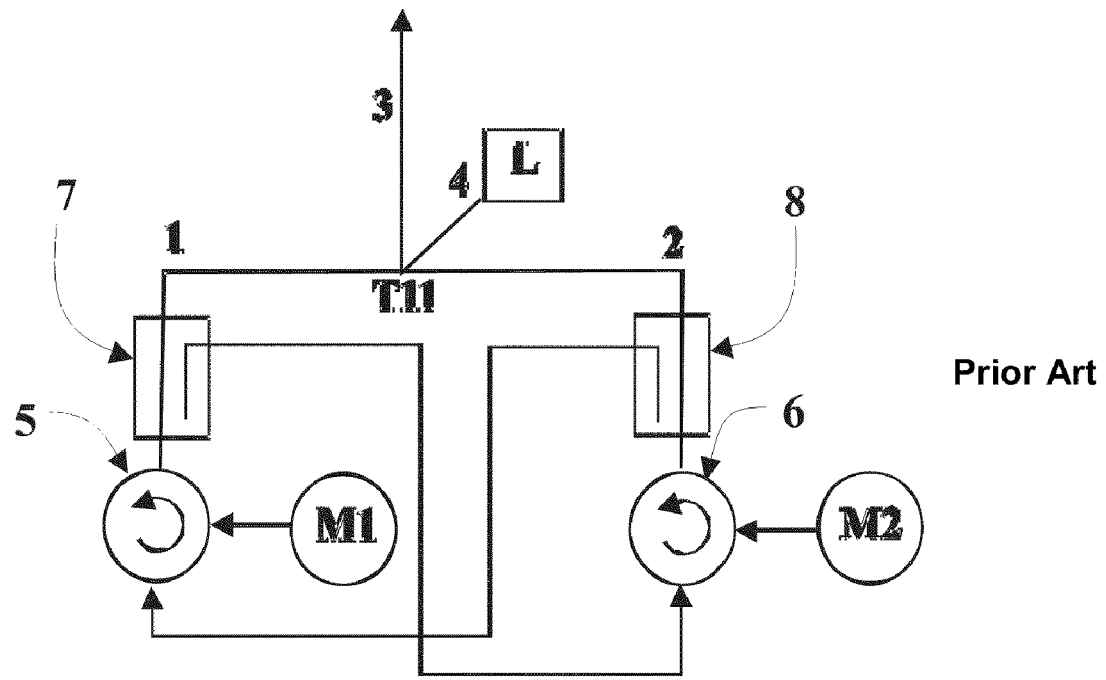
FIG. 3, labeled as "prior art," illustrates a power combining magic tee and components schematic for phase locking two magnetrons.
Figure 4:
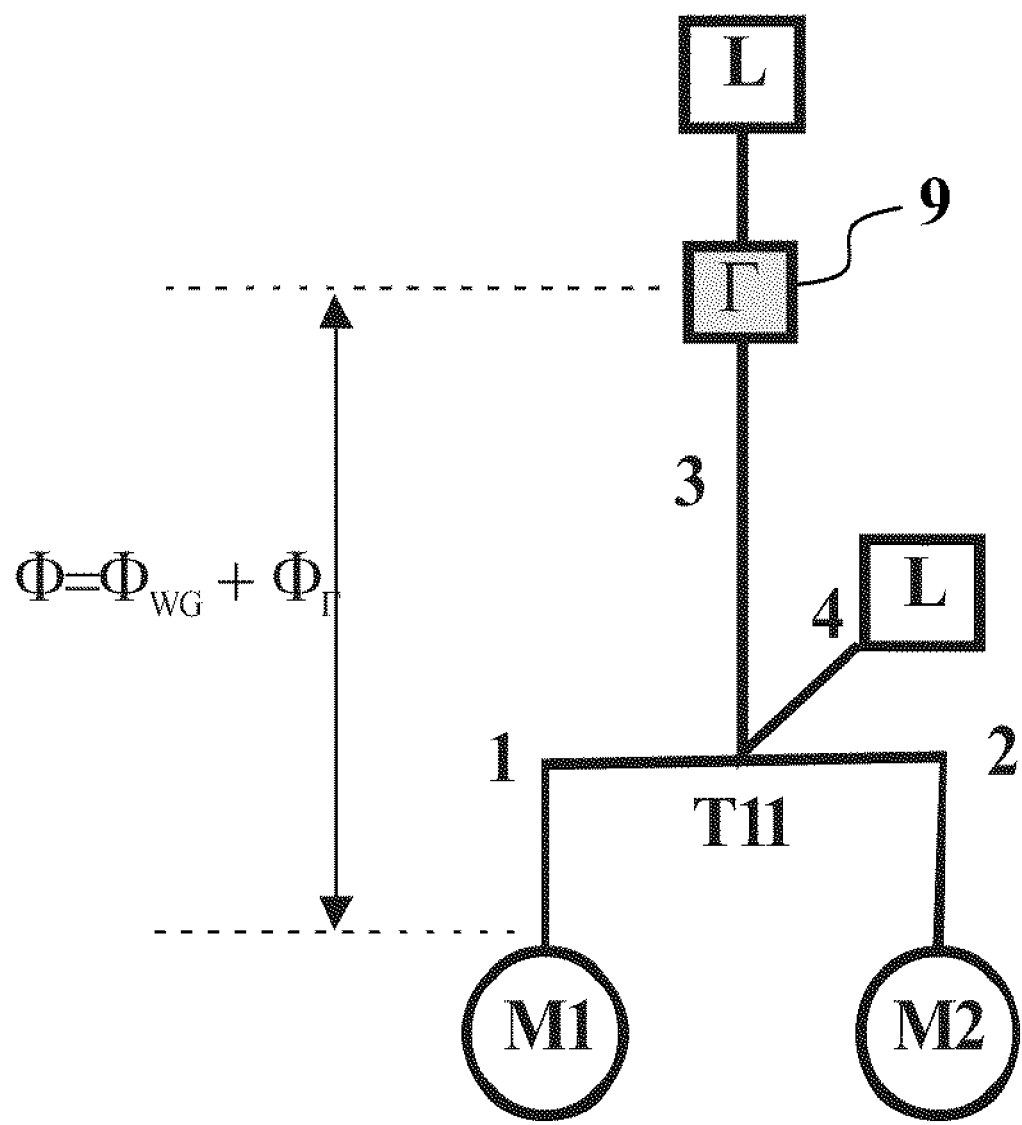
FIG. 4 is a magic tee schematic with a deliberate port 3 output load mismatch caused by the insertion of a partial obstruction between port 3 and the matched load L.

The invention is a modification of the magic tee power combiner previously described to accomplish cross coupling in both phase and magnitude. A similar modification to a side wall 3 dB coupler or a top wall 3 dB coupler will produce results similar to that for a magic tee. In its basic form, a single magic tee with two sources can be used for the invention. Referring to FIG. 4, it is an inherent characteristic of a magic tee that a signal entering port 3 is propagated through the tee and divided equally in power but keeping the same phase to ports 1 and 2. None of this power is propagated to port 4. With normal utilization of a magic tee, the output port 3 would be delivered to a matched load in such a manner that there would be no reflection back into port 3. If, however, the output from port 3 is not matched, power will reflect back into port 3 and propagate as described to ports 1 and 2. The extent of apparatus required to accomplish the mismatch is insignificant compared to that used historically in the prior art. Furthermore, the amount of power required to accomplish the phase locking is the same regardless of the means used to accomplish it. The power level can be in the range of −13 dB to −40 dB relative to the rated power. This range of power levels is consistent with the early work of Richard Adler as published in the Proceedings of the Institute of Radio Engineers, 1946, pp 351-377. This power level is typically measured at the input reference plane of the magnetron. The level of the locking power signal has a strong dependence on the difference between the natural oscillation frequencies of the two, or more, sources. This frequency spread is typically less than ~0.5% corresponding to the previously stated power level range. Thus the power required to phase lock is less that a maximum of 5% and therefore insignificant in terms of affecting the over-all efficiency of the total system.

In accordance with a preferred embodiment of the present invention (FIG. 4), a partial obstruction 9 with a reflection coefficient Γ is inserted between port 3 and the matched load L to create a deliberate mismatch. The mismatch can be accomplished by any of several types of partial obstructions in the wave guide. Such an object results in a complex reflection coefficient. The reflected signal has a specific amplitude and phase designated as ∠$_\Gamma$, equivalently expressible as $\Gamma = \alpha e^{-j\Phi(\Gamma)}$. The phase due to the waveguide length between the reference plane of the partial obstruction and the reference plane of the oscillator is designated as $\Phi_{WG}$. The total phase difference Φ between the oscillator and the partial obstruction 9 is the sum as indicated in FIG. 4.

The phase path from source 1 to the partial obstruction 9 and from source 2 to the partial obstruction 9 must each be an integral number of wavelengths. The phase path can include the phase associated with the partial obstruction 9, Φr, and the phase length of the respective waveguide $\Phi_{WG}$. Furthermore, these phase paths must an integral number of wave lengths. Thus the critical location, or effective phase, of the partial obstruction 9 can be reckoned by both the waveguide distance and the phase component due to the complex reflection coefficient of the partial obstruction. Specifically, $\Phi = \Phi_{WG} + \Phi r$ must have an electrical phase length equal to n2π radians, where n is an integer.

A post 10 is an example of one of the many possible suitable partial obstructions and is illustrated in FIG. 5. For example, the inventors determined the attenuation and phase of a one inch diameter post 10 with the center positioned over the range of 1.1 to 2.5 inches from the wall, results of which are plotted in FIGS. 6 and 7. The waveguide used during testing was a WR-975 waveguide operating at a frequency of 917 MHz.

Figure 6:
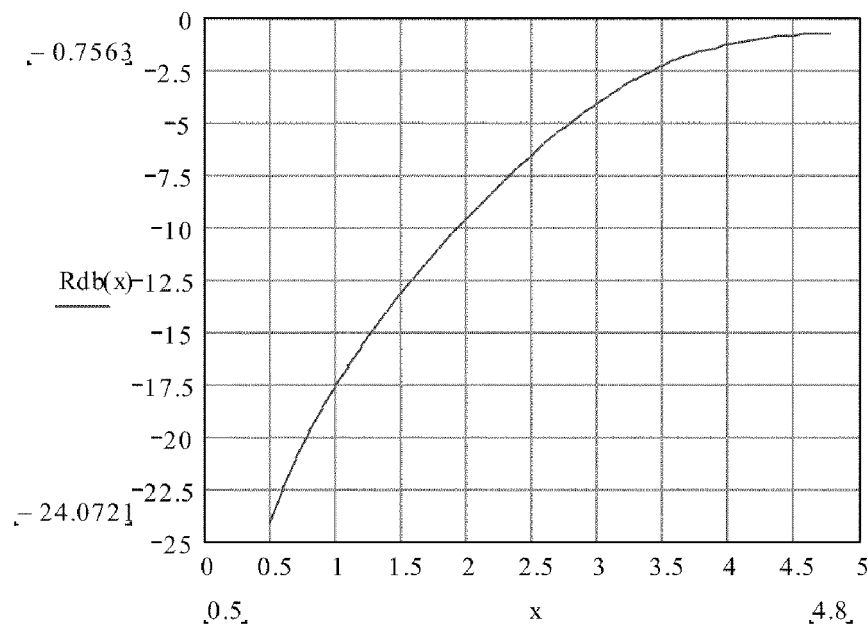
FIGS. 6 and 7 are graphical representations of attenuations and phase for a one inch diameter post with the center positioned over the range of 1.1 to 2.5 inches from the wall for a WR-975 rectangular waveguide.
Figure 7:
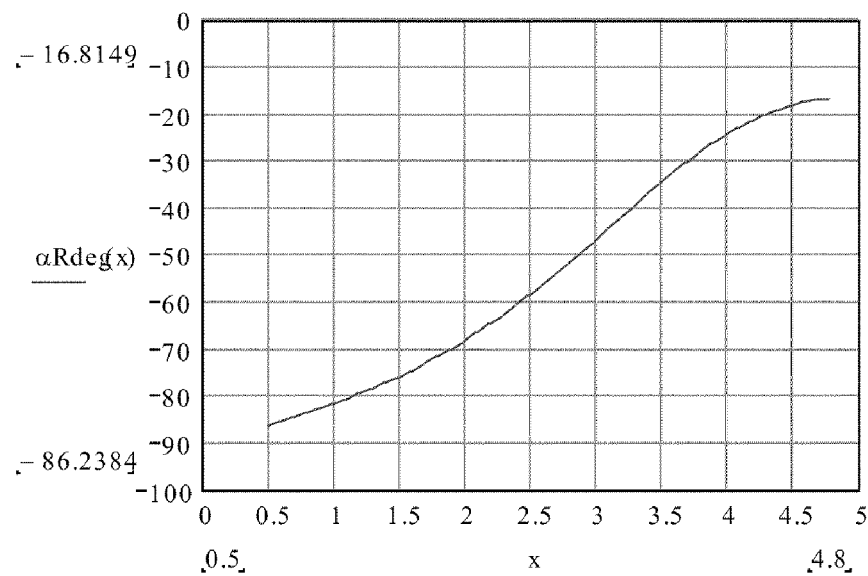

From experimental data, the typical amplitude reflection required to maintain the phase lock of magnetrons was determined to be in the range of −20 dB to −40 dB. As shown by FIG. 6, this reflection level can be easily obtained using a 1"diameter post with the center about 0.5" from the waveguide wall. The phase shown in FIG. 7 is relative to the plane at the center of the post. The total phase from the post includes this value plus the electrical phase length from the center of the post to the phase reference plane at the oscillator. As previously noted above, this total phase should be n2π radians to accomplish phase locking.

Figure 8:
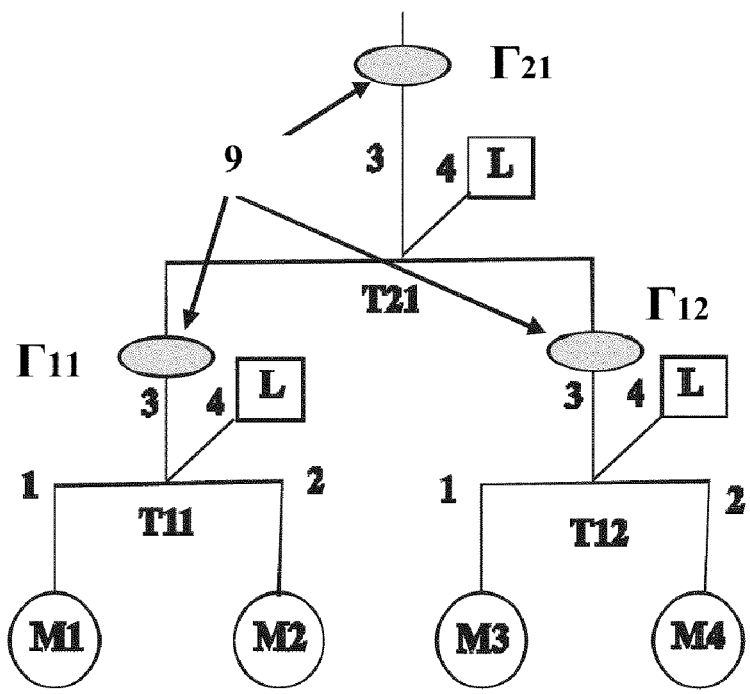
FIG. 8 illustrates four magnetrons arranged in an array of three magic tees to accomplish phase locking and power combining.

FIG. 8 shows a magic tee configuration to accomplish the phase locking and power combining of four magnetrons. Operation of a phase-locking and power-combining apparatus shown in FIG. 8 functions as follows. When the magnetrons M1, M2, M3 and M4 are initially energized, they are not phase locked. The pair M1 and M2 can then caused to phase lock due to fact that they are coupled to each other by means of the reflection from the partial obstruction (i.e., post) located downstream of port 3 of magic tee T$_{11}$. If the required locking signal is taken as P$_L$ dB (power required for phase lock in dB), the power from M1 reaching M2 is reduced by 3 dB going from M1 to the partial obstruction. Power is then reduced by 20 log(ABS(Γ$_{11}$)) dB, where Γ$_{11}$ is the reflection coefficient of the partial obstruction, and it then loses an additional 3 dB passing back through port 3 to port 2 of the T$_{11}$ to M2. Thus the required reflection coefficient, Γ$_{11}$, must be such that the reflected power is 6 dB higher than P$_L$ dB, as provided by the following Equation 3:

$$\Gamma 11 = 10^{\left(\frac{P_L dB + 6}{20}\right)} \qquad \text{(EQ. 3)}$$

For example if P$_L$ dB=−30 using Equation 3, then Γ$_{11}$=0.0631, or Γ$_{11}$=−24 dB. After phase lock is accomplished, the power exiting port 3 is increased by 3 dB because of the phase lock, thus the power now being returned to M1 and M2 is 3 dB higher, or −21 dB, which increases the stability of the phase lock of the pair M1 and M2 and the pair M3 and M4. The basis of the dB figures is the power output of one magnetron, either M1 or M2, assumed to be equal. Following the same rationale, the reflection from the partial obstruction downstream of port 3 of T$_{21}$ would be such that the power from T$_{11}$ that is passed through T$_{21}$ and reflected from the partial obstruction (Γ$_{21}$) downstream of port 3 of T$_{21}$, back to port 3 of T$_{12}$, is equal to P$_L$ dB plus 3 dB. Since the input to port 1 of T$_{21}$ is 3 dB higher than the input to port 1 of T$_{12}$, then the partial obstruction characteristics of Γ$_{21}$ should be the same as Γ$_{11}$, except that the power handling rating is 3 dB higher. Given the foregoing, those skilled in the art should now appreciate that the process can be extended to more levels of magic tees and the required partial obstruction in port 3 will be the same except for an increase of 3 dB in the power rating for each successive level.

Figure 9:
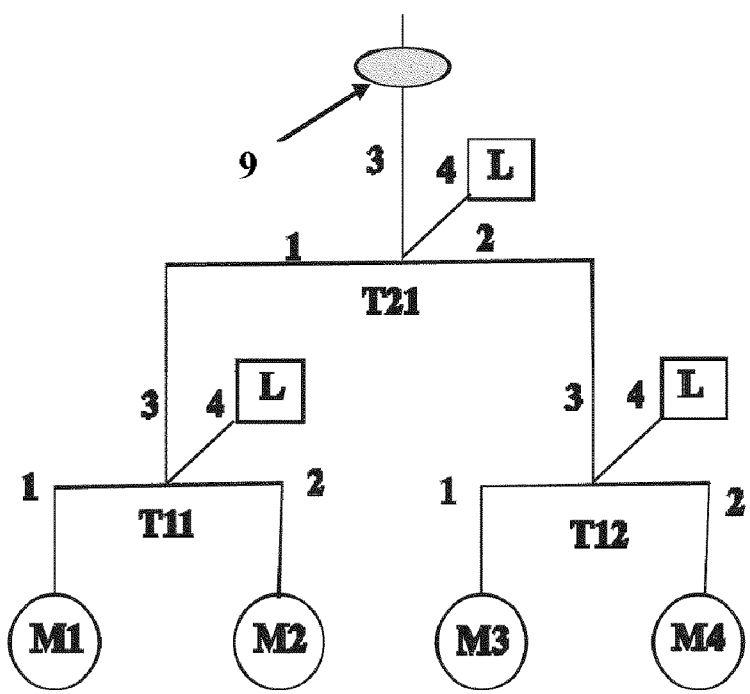
FIG. 9 illustrates a simpler system configuration than is illustrated in FIG. 8, with a reduction in the number of partial obstructions from three to one located at the final power combined output port.

The configuration of FIG. 8 can be simplified and the same phase locking and power combining accomplished by using only a single partial obstruction 9 at the output of tee T$_{21}$, as shown in FIG. 9. In this configuration the reflection coefficient Γ21, required to provide P$_L$ dB to each magnetron before any phase locking occurs is determined as follows. The power from M1 must pass through T$_{12}$ and T$_{21}$ to reach Γ$_{21}$, then must travel back through T$_{21}$ and T$_{11}$ or T$_{12}$ to reach another magnetron. Thus the total power loss is P$_L$ dB plus 12 dB. The reflection coefficient, Γ$_{21}$, can therefore be determined given the following Equation 4:

$$\Gamma 21 = 10^{\left(\frac{P_L dB + 12}{20}\right)} \qquad \text{(EQ. 4)}$$

Given Equation 4, if the value of P$_L$ dB=−30, then Γ$_{21}$ for the case shown in FIG. 9 is, Γ$_{21}$=0.1259 or −18 dB. Although the Γ$_{21}$ is 6 dB more than the reflection of Γ$_{11}$ in the case of FIG. 8, which has partial obstructions, the overall total reflection is the same.

The simpler configuration in FIG. 9 compared to that of FIG. 8, reduces the number of partial obstructions 9 to one instead of three and is therefore preferred. Extensions to greater numbers follow the same procedure.

Some clear advantages of the invention are that: (1) instead of using a complex external waveguide structure to provide the phase locking signal as in the prior art, the invention uses the existing magic tee power combiner structure plus a simple partial reflecting obstruction located within the assembly; and (2) the power combining features of the magic tee array provides precise requirements for distributing the locking signals in the reverse direction with the proper phase and amplitude balance, as required to sustain the phase lock of the oscillators. The invention may be implemented with a partial obstruction at each level of the magic tee array, or with a single partial obstruction at the last output port of the final tee. The single obstruction at the output configuration is smaller and lighter and is the preferred embodiment.

Although the post-type partial obstruction was used to explain the invention, it should now be appreciated that the same results can be obtained using a post that does not extend entirely across the waveguide and that can be adjusted by the amount it is inserted. Other partial obstructions can be used such as pieces of dielectric, or various partial obstructions, that extend a partial distance across the waveguide. Any total number of oscillators can be phase locked and power combined, provided that that number is a power of 2, i.e. $2^n$, where n is an integer. An array of 8 magnetrons using the invention with a single partial obstruction at the output of the final magic tee assembly has been successfully built and tested. The single partial obstruction was set to ~−10 dB and produced a very solid lock. Based on the above analysis the locking signal delivered to the magnetrons before locking occurs is ~−28 dB. It is possible that locking could be reliably obtained with the partial obstruction set to a lower power reflection.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system for cross-coupling in both phase and magnitude the outputs from similar microwave oscillator sources by inputting their outputs Into two ports of a modified waveguide magic tee power combiner, the modified magic tee power combiner comprising:
 a. a magic tee power combiner having four ports such that if oscillator inputs to ports 1 and 2 are cross-coupled in phase and magnitude, then the combined power of the inputs will be output from port 3 and no power will exit port 4;
 b. a matched load connected to port 3 and port 4;
 c. similar first and second microwave oscillator sources;
 d. a partial obstruction with a reflection coefficient $\Gamma$ located between port 3 and the matched load, said obstruction causing a reflected signal with a phase-locking power PL, an amplitude $\alpha$, and a phase designated as $\phi\Gamma$ where $\Gamma=\alpha e^{-j\phi\Gamma}$; and
 e. a requirement that the total phase difference $\phi 1$ between said first oscillator source and said partial obstruction is equal to $\phi WG1+\phi\Gamma$ and has an electrical phase length equal to $n2\pi$, where n is an integer and $\phi WG1$ is the phase due to the waveguide length between a reference plane of the partial obstruction and a reference plane of said first oscillator and a similar requirement for $\phi 2$ of said second oscillator, whereby said oscillator sources are coupled to each other by means of the signal reflected from said partial obstruction thereby obtaining a single coherent microwave output from port 3 having a power level approximately twice that of the two microwave sources.

2. The system for cross-coupling in both phase and magnitude the outputs from similar microwave oscillator sources of claim 1, wherein said similar first and second microwave oscillator sources have a difference between their natural oscillation frequencies of approximately 0.5 percent or less.

3. The system for cross-coupling in both phase and magnitude the outputs from similar microwave oscillator sources of claim 1, wherein the power PL of said reflected signal is in the range of −20 dB to −40 dB relative to the rated power of said oscillator sources as measured at the input reference plane of said microwave oscillators.

4. A multi-level system for cross-coupling In both phase and magnitude the outputs from similar microwave oscillator sources, the multi-level system comprised of:
 a. a top level comprised of the modified magic tee combiner of claim 2; and
 b. a plurality of secondary levels comprised of a plurality of magic tee combiners the same as those of claim 2 but without said partial obstruction, the port 3 output of each lower level becoming one of the oscillator inputs to the next higher level of magic tee combiners, whereby a plurality of oscillator sources are coupled to each other by means of the signal reflected from the top level partial obstruction thereby obtaining a single coherent microwave output from the top level port 3 having a power level approximately n times that of the lowest level microwave sources, n being the number of levels.

5. A multi-level system for cross-coupling in both phase and magnitude the outputs from similar microwave oscillator sources, the multi-level system comprised of:
 a. a top level comprised of the modified magic tee combiner of claim 2; and
 b. a plurality of secondary levels comprised of a plurality of magic tee combiners the same as those of claim 2, the port 3 output of each lower level becoming one of the oscillator inputs to the next higher level of magic tee combiners.

6. A system for cross-coupling In both phase and magnitude the outputs from similar microwave oscillator sources by inputting their outputs into two ports of a modified waveguide side wall 3 dB coupler, the modified side wall 3 dB coupler comprising:
 a. a side wall 3 dB coupler having four ports such that if the oscillator source input to ports 2 lags the oscillator input source to port 1 by 90 degrees in phase and the input magnitudes are the same, then the combined power of the inputs will be output from port 3 and no power will exit port 4;
 b. a matched load connected to port 3 and port 4;
 c. similar first and second microwave oscillator sources;
 d. a partial obstruction with a reflection coefficient $\Gamma$ located between port 3 and the matched load, said obstruction causing a reflected signal with a phase-locking power PL, an amplitude $\alpha$, and a phase designated as $\phi\Gamma$ where $\Gamma=\alpha e-j\phi\Gamma$; and
 e. a requirement that the total phase difference $\phi 1$ between said first oscillator source and said partial obstruction is equal to $\phi WG1+\phi\Gamma$ and has an electrical phase length equal to $n2\pi$, where n is an integer and $\phi WG1$ Is the phase due to the waveguide length between a reference plane of the partial obstruction and a reference plane of said first oscillator and a similar requirement for $\phi 2$ of said second oscillator, whereby said oscillator sources are coupled to each other by means of the signal reflected from said partial obstruction thereby obtaining a single coherent microwave output from port 3 having a power level approximately twice that of the two microwave sources.

7. A multi-level system for cross-coupling in both phase and magnitude the outputs from similar microwave oscillator sources, the multi-level system comprised of:
   a. a top level comprised of the modified side wall 3 dB coupler of claim 6; and
   b. a plurality of secondary levels comprised of a plurality of side wall 3 dB couplers the same as those of claim 6 but without said partial obstruction, the port 3 output of each lower level becoming one of the oscillator Inputs to the next higher level of side wall 3 dB couplers, whereby a plurality of oscillator sources are coupled to each other by means of the signal reflected from the top level partial obstruction thereby obtaining a single coherent microwave output from the top level port 3 having a power level approximately n times that of the lowest level microwave sources, n being the number of levels.

8. A multi-level system for cross-coupling in both phase and magnitude the outputs from similar microwave oscillator sources, the multi-level system comprised of:
   a. a top level comprised of the modified side wall 3 dB coupler of claim 6; and
   b. a plurality of secondary levels comprised of a plurality of side wall 3 dB couplers the same as those of claim 6, the port 3 output of each lower level becoming one of the oscillator inputs to the next higher level of side wall 3 dB couplers.

9. A system for cross-coupling In both phase and magnitude the outputs from similar microwave oscillator sources by inputting their outputs into two ports of a modified waveguide top wall 3 dB coupler, the modified top wall 3 dB coupler comprising:
   a. a top wall 3 dB coupler having four ports such that If the oscillator source Input to ports 2 leads the oscillator source input to port 1 by 90 degrees in phase and the input magnitudes are the same, then the combined power of the inputs will be output from port 3 and no power will exit port 4;
   b. a matched load connected to port 3 and port 4;
   c. similar first and second microwave oscillator sources;
   d. a partial obstruction with a reflection coefficient $\Gamma$ located between port 3 and the matched load, said obstruction causing a reflected signal with a phase-locking power PL, an amplitude $\alpha$, and a phase designated as $\phi\Gamma$ where $\Gamma = \alpha e^{-j\phi\Gamma}$; and
   e. a requirement that the total phase difference $\phi 1$ between said first oscillator source and said partial obstruction is equal to $\phi WG1 + \phi\Gamma$ and has en electrical phase length equal to $n2\pi$, where n is an integer and $\phi WG1$ is the phase due to the waveguide length between a reference plane of the partial obstruction and a reference plane of said first oscillator and a similar requirement for $\phi 2$ of said second oscillator, whereby said oscillator sources are coupled to each other by means of the signal reflected from said partial obstruction thereby obtaining a single coherent microwave output from port 3 having a power level approximately twice that of the two microwave sources.

10. A multi-level system for cross-coupling In both phase and magnitude the outputs from similar microwave oscillator sources, the multi-level system comprised of:
    a. a top level comprised of the modified top wall 3 dB coupler of claim 9; and
    b. a plurality of secondary levels comprised of a plurality of top wall 3 dB couplers to the same as those of claim 9 but without said partial obstruction, the port 3 output of each lower level becoming one of the oscillator inputs to the next higher level of top wall 3 dB couplers, whereby a plurality of oscillator sources are coupled to each other by means of the signal reflected from the top level partial obstruction thereby obtaining a single coherent microwave output from the top level port 3 having a power level approximately n times that of the lowest level microwave sources, n being the number of levels.

11. A multi-level system for cross-coupling in both phase and magnitude the outputs from similar microwave oscillator sources, the multi-level system comprised of:
    a. a top level comprised of the modified top wall 3 dB coupler of claim 9; and
    b. a plurality of secondary levels comprised of a plurality of top wall 3 dB couplers the same as those of claim 9, the port 3 output of each lower level becoming one of the oscillator inputs to the next higher level of top wall 3 dB couplers.

\* \* \* \* \*